(12) United States Patent
Zhu et al.

(10) Patent No.: US 11,304,292 B2
(45) Date of Patent: Apr. 12, 2022

(54) CIRCUIT BOARD AND UNMANNED AERIAL VEHICLE INCLUDING THE SAME

(71) Applicant: SZ DJI TECHNOLOGY CO., LTD., Shenzhen (CN)

(72) Inventors: Yupin Zhu, Shenzhen (CN); Jinji Li, Shenzhen (CN); Youcheng Zhao, Shenzhen (CN)

(73) Assignee: SZ DJI TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/919,740

(22) Filed: Jul. 2, 2020

(65) Prior Publication Data
US 2020/0337151 A1 Oct. 22, 2020

Related U.S. Application Data

(63) Continuation of application No. PCT/CN2018/071605, filed on Jan. 5, 2018.

(51) Int. Cl.
*H05K 1/02* (2006.01)
*B64C 39/02* (2006.01)
*G01C 19/56* (2012.01)
*G01P 15/08* (2006.01)
(Continued)

(52) U.S. Cl.
CPC ......... *H05K 1/0277* (2013.01); *B64C 39/024* (2013.01); *G01C 19/56* (2013.01); *G01P 15/08* (2013.01); *H05K 1/189* (2013.01); *B64C 2201/00* (2013.01); *G01C 21/12* (2013.01); *H05K 2201/10151* (2013.01); *H05K 2201/10189* (2013.01)

(58) Field of Classification Search
CPC .... H05K 1/0277; H05K 1/189; B64C 39/024; B64C 2201/00; G01C 19/56
See application file for complete search history.

(56) References Cited

U.S. PATENT DOCUMENTS 9,139,310 B1 * 9/2015 Wang .................... B64F 1/0297
10,307,667 B2 * 6/2019 Condon .................. A63F 13/00
(Continued)

FOREIGN PATENT DOCUMENTS

CN 104931052 A 9/2015
CN 204675827 U 9/2015
(Continued)

OTHER PUBLICATIONS

The World Intellectual Property Organization (WIPO) International Search Report for PCT/CN2018/071605 dated Oct. 11, 2018 6 pages.

*Primary Examiner* — Hoa C Nguyen
(74) *Attorney, Agent, or Firm* — Anova Law Group, PLLC

(57) ABSTRACT

A circuit board includes a board body including a wiring; a micro-control unit, arranged on the board body; and an inertial measurement unit arranged on the board body and in communication with the micro-control unit via the wiring to transmit inertial measurement data detected by the inertial measurement unit to the micro-control unit, and where the board body includes a main body part and an isolated part located at a peripheral of the main body part, the micro-control unit is supported on the main body part, and the inertial measurement unit is supported on the isolated part.

20 Claims, 6 Drawing Sheets

(51) Int. Cl.
*H05K 1/18* (2006.01)
*G01C 21/12* (2006.01)

(56) References Cited

U.S. PATENT DOCUMENTS

| | | | |
|---|---|---|---|
| 2005/0160814 A1* | 7/2005 | Vaganov | G01P 15/123 |
| | | | 73/514.01 |
| 2005/0242991 A1* | 11/2005 | Montgomery | G01S 19/15 |
| | | | 342/357.36 |
| 2016/0119541 A1 | 4/2016 | Aguilar et al. | |
| 2016/0381798 A1 | 12/2016 | Wu et al. | |
| 2017/0191829 A1* | 7/2017 | Van Schoyck | G01C 5/005 |
| 2019/0056228 A1* | 2/2019 | Chen | G01C 19/5783 |

FOREIGN PATENT DOCUMENTS

| | | |
|---|---|---|
| CN | 107172840 A | 9/2017 |
| CN | 206546172 U | 10/2017 |
| CN | 107478224 A | 12/2017 |
| DE | 102008002546 A1 | 12/2009 |
| EP | 3683545 A1 | 7/2020 |

* cited by examiner

CIRCUIT BOARD AND UNMANNED AERIAL VEHICLE INCLUDING THE SAME

CROSS-REFERENCE TO RELATED APPLICATION

This application is a continuation of International Application No. PCT/CN2018/071605, filed Jan. 5, 2018, the entire content of which is incorporated herein by reference.

TECHNICAL FIELD

The present disclosure relates to an inertial measurement device, and particularly to a circuit board including the inertial measurement device and an unmanned aerial vehicle including such a circuit board.

BACKGROUND

An inertial measurement unit is a sensor for detecting attitude information of a moving object. The inertial measurement unit generally includes an accelerometer and a gyroscope, where the accelerometer is used for detecting an acceleration component of the object, and the gyroscope is used for detecting angle information of the object. Being able to measure both the acceleration and the angular velocity information of the object, the inertial measurement unit is regularly used as a core component for navigation and guidance, and has been widely used in devices such as vehicles, ships, robots, and aircrafts that require motion control.

The inertial measurement unit is supported on a board body of the circuit board, and can be influenced by thermal stress generated by the circuit board and other heat-generating components, and accordingly the measurement precision of the inertial measurement unit is compromised.

SUMMARY

In one aspect, embodiments of the present disclosure provide a circuit board. The circuit board includes a board body including a wiring; a micro-control unit, arranged on the board body; and an inertial measurement unit arranged on the board body and in communication with the micro-control unit via the wiring to transmit inertial measurement data detected by the inertial measurement unit to the micro-control unit, and where the board body includes a main body part and an isolated part located at a peripheral of the main body part, the micro-control unit is supported on the main body part, and the inertial measurement unit is supported on the isolated part.

In a second aspect, embodiments of the present disclosure provide an unmanned aerial vehicle. The unmanned aerial vehicle includes a vehicle body, a vehicle arm arranged on the vehicle body, and a circuit board arranged in the vehicle body. The circuit board includes a board body including a wiring; a micro-control unit, arranged on the board body; and an inertial measurement unit arranged on the board body and in communication with the micro-control unit via the wiring to transmit inertial measurement data detected by the inertial measurement unit to the micro-control unit, and where the board body includes a main body part and an isolated part located at a peripheral of the main body part, the micro-control unit is supported on the main body part, and the inertial measurement unit is supported on the isolated part.

In the above-mentioned circuit board, the circuit board includes the board body and the micro-control unit and the inertial measurement unit arranged on the board body, where the board body includes the main body part and the isolated part positioned at a peripheral of the main body part, and where the micro-control unit is supported on the main body part and the inertial measurement unit is supported on the isolated part. Accordingly, because the inertial measurement unit is located at the peripheral of the main body part and thus is away from power-consuming components on the main body part, impact of thermal stress on the inertial measurement unit is reduced, and accuracy of inertial measurement data thus detected is ensured.

BRIEF DESCRIPTION OF THE DRAWINGS

To illustrate more clearly the technical solutions of embodiments of the present disclosure, reference is now made to the accompanying drawings. Obviously, the drawings described below are merely some embodiments of the present disclosure. To those skilled in the art, other drawings may be obtained according to these drawings without creative efforts.

DETAILED DESCRIPTION OF THE EMBODIMENTS

In connection with the accompanying drawings according to embodiments of the present disclosure, technical solutions in the embodiments of the present disclosure are described. Apparently, the embodiments thus described are merely a part of the embodiments of the present invention and do not constitute the embodiments in their entirety. According to the embodiments of the present disclosure, all other embodiments obtained by one of ordinary skill in the art without creative efforts are within the scope of the protection of the present disclosure.

Example embodiments are described in detail herein, with examples of which illustrated in the accompanying drawings. The following description relates to the accompanying drawings, where like numerals refer to like or similar elements throughout various drawings unless otherwise indicated. The embodiments described below do not represent all embodiments consistent with the present disclosure. Rather, they are merely examples of apparatuses and/or methods consistent with some aspects of the present disclosure as detailed in the appended claims.

The terminology used herein is for the purpose of describing particular embodiments only and is not intended to be limiting on the present disclosure. As used in the present disclosure and the appended claims, the singular forms "a," "an" and "the" are intended to include the plural forms as well, unless the context clearly indicates otherwise. It should also be understood that the term "and/or" as may be used herein refers to and encompasses any or all possible combinations of one or more associated items as listed.

In view of the drawings, detailed description is provided below to the circuit board and the unmanned aerial vehicle. In absence of conflict, below-mentioned embodiments and features mentioned in these embodiments may be combined with one and another.

The unmanned aerial vehicle according to embodiments of the present disclosure includes a vehicle body, a vehicle arm arranged on the vehicle body, and a circuit board 100 arranged in the vehicle body.

Figure 1:
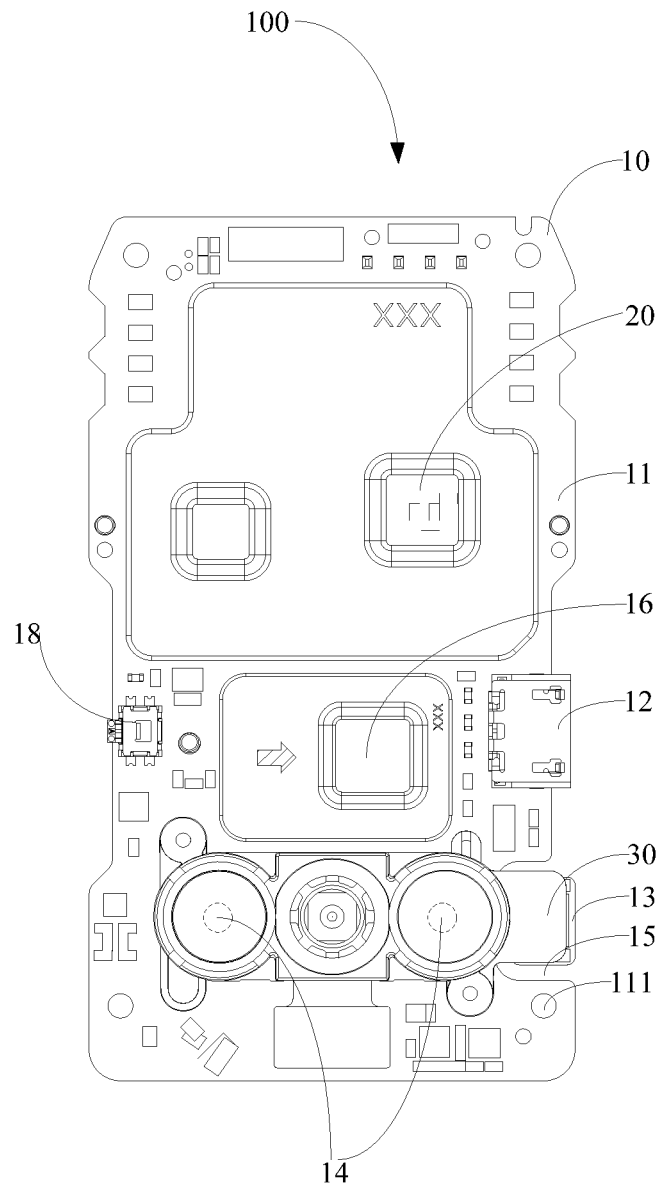
FIG. 1 is a schematic diagram of a circuit board according to one embodiment.

FIG. 1 is a schematic diagram of the circuit board according to one embodiment. The circuit board 100 of FIG. 1 may be used not only in unmanned aerial vehicles, but also in unmanned vehicles, robots, and gimbal platforms, and are not limited to such.

The circuit board 100 includes a board body 10, a micro-control unit 20, and an inertial measurement unit 30. The board body 10 includes a wiring, and the micro-control unit 20 and the inertial measurement unit 30 are arranged on the board body 10. The inertial measurement unit 30 is in communication connection with the micro-control unit 20 via the wiring of the board boy 10 to transmit inertial measurement data thus detected by the inertial measurement unit to the micro-control unit 20.

The board boy 10 includes a main body part 11 and an isolated part 13 arranged at a peripheral of the main body part 11. The micro-control unit 20 is supported on the main body part 11, and the inertial measurement unit 30 is supported on the isolated part 13. Accordingly, because the inertial measure unit 30 is located at the peripheral of the main body part 11 and thus is away from power-consuming components on the main body part 11, impact of thermal stress on the inertial measurement unit 30 is reduced, and accuracy of inertial measurement data thus detected is ensured.

The micro-control unit 20 is a core element of an unmanned aerial vehicle, and as a central controller of the unmanned aerial vehicle, the micro-control unit 20 is used for controlling the main function of the unmanned aerial vehicle. For example, the micro-control unit 20 may be used for managing the control system working mode of the unmanned aerial vehicle, for resolving the control rate and generating a control signal, for managing the sensors and the servo system in the unmanned aerial vehicle, for controlling other tasks and data exchange among electronic components in the unmanned aerial vehicle, and for receiving ground instructions to control flight operation of the unmanned aerial vehicle and collecting the attitude information of the unmanned aerial vehicle, and the like.

The inertial measurement unit 30 is used for determining the attitude information of the unmanned aerial vehicle and transmitting the determined attitude information to the micro-control unit 20 to assist the micro-control unit 20 in determining follow-up operations. A process via which the inertial measurement unit 30 determines the attitude information of the unmanned aerial vehicle may be carried out as follows: an accelerometer (or an acceleration sensor) detects an acceleration component of the unmanned aerial vehicle relative to the ground vertical line; a gyro (or the speed sensor) detects the angle information of the unmanned aerial vehicle; an analog-to-digital converter receives the analog variable output by each sensor and converts the analog variable output into a digital signal; and the micro-control unit determines and outputs at least one of the pitch angle information, the roll angle information, and the heading angle information of the unmanned aerial vehicle according to the digital signal to determine the attitude information of the unmanned aerial vehicle.

FIG. 2 through FIG. 6 are each a schematic diagram of the board body 10. A spacing groove 15 is positioned between the isolated part 13 and the main body part 11, and the isolated part 13 is connected to the main body part 11 via a connecting part 17. The connecting part 17 is used for wiring, and the inertial measurement unit 30 is in communication connection with the micro-control unit 20 via the wiring of the connecting part 17 to transmit the detected inertial measurement data to the micro-control unit 20. Because the spacing groove 15 is positioned between the isolated part 13 and the main body part 11, mechanical stress and thermal stress transmitted from the main body part 11 to the isolated part 13 can be reduced to better ensure the accuracy of inertial data measurement as detected by the inertial measurement unit 30.

In the embodiments as shown, the isolated part 13 is formed integrally with the main body part 11. In other embodiments, the isolated part 13 may be in electrical connection with the main body part 11 via flexible circuit board.

The board boy 10 extends from its peripheral to form the spacing groove 15, such that the spacing groove 15 separates the board body 10 to define the main body part 11 and the isolated part 13, and the main body part 11 partially surrounds the isolated part 13. In these embodiments, the isolated part 13 is of a rectangle in shape, and may be of a trapezoid, a circle, or a semi-circle in shape, but is not limited to such. The spacing groove 15 may extend in any shape defined according to a shape of the isolated part 13.

In the embodiments as shown, the spacing groove 15 includes a first spacing groove 151, and second spacing groove 153, and a third spacing groove 155, where the first spacing groove 151 and the second spacing groove 153 are respectively positioned at two opposing sides of the isolated part 13, where the third spacing groove 155 is positioned at a side away from an external side of the isolated part 13, where two ends of the third spacing groove 155 are respectively connected to an end of the first spacing groove 151 and an end of the second spacing groove 153. In this embodiment, the first spacing groove 151, the second spacing groove 153, and the third spacing groove 155 each extend along a straight line, but are not limited to such.

Figure 2:
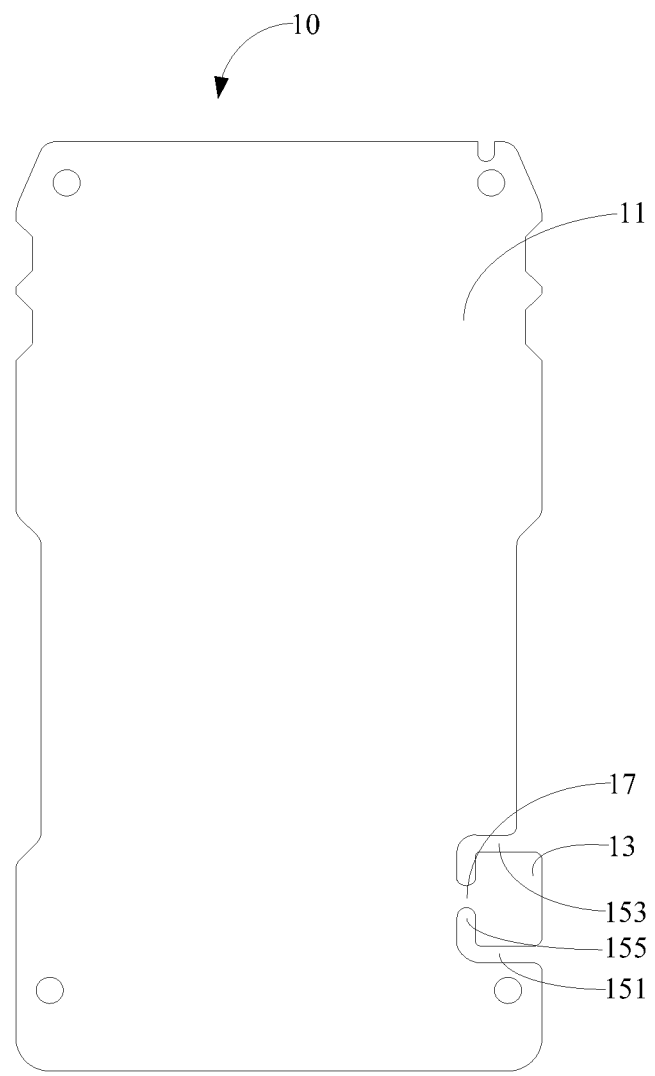
FIG. 2 is a schematic diagram of a board body referenced in FIG. 1 according to another embodiment.

In view of FIG. 2, the connecting part 17 passes through an intermediate position or a middle position of the third spacing groove 155, and connects the isolated part 13 with the main body part 11. Because the connecting part 17 is positioned at the intermediate position of the third spacing groove 155, the stress transmitted from the main body part 11 via the connecting part 17 to the isolated part 13 is partially offset, such that stress impact onto the inertial measurement unit 30 is further decreased.

In the above-mentioned embodiments, the main body part 11 includes a screw hole 111, where the screw hole 111 is positioned close to the first spacing groove 151, and the circuit board 100 further includes a USB interface 12 arranged on the main body part 11, where the USB interface 12 is positioned close to the second spacing groove 153. Accordingly, the stress at the screw hole 111 and the stress generated via use of the USB interface 12 is not easily transmitted to the isolated part 13 via the connecting part 17 located at the intermediate position of the third spacing groove 155.

Figure 3:
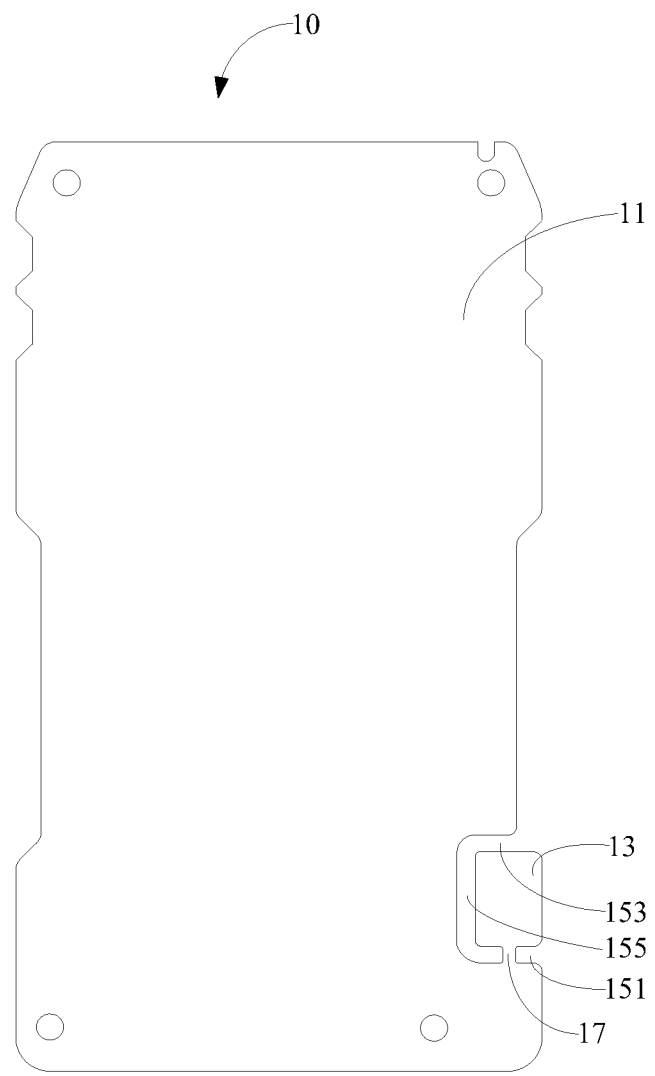
FIG. 3 is a schematic diagram of a board body referenced in FIG. 1 according to yet another embodiment.

In another embodiment, and in view of FIG. 3, the connecting part 17 passes through an intermediate position of the first spacing groove 151, and connects the isolated part 13 to the main body part 11. At this time, the screw hole 111 and the USB interface 12 are positioned away from the first spacing groove 151.

Figure 4:
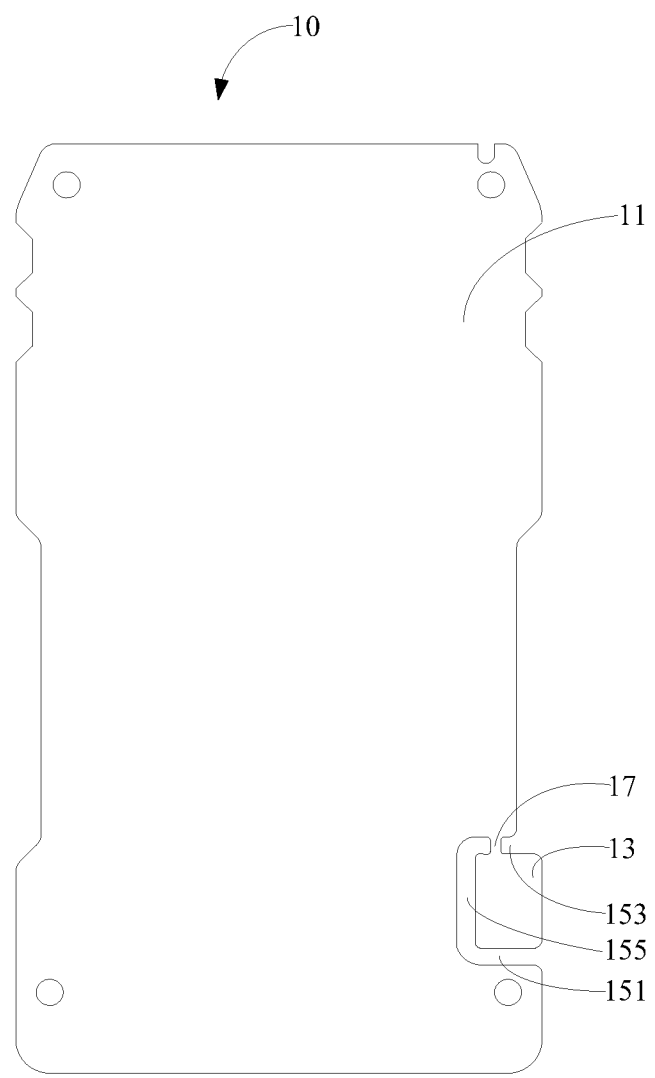
FIG. 4 is a schematic diagram of a board body referenced in FIG. 1 according to yet another embodiment.

In another embodiment, and in view of FIG. 4, the connecting part 17 passes through an intermediate position of the second spacing groove 153, and connects the isolated part 13 to the main body part 11. At this time, the screw hole 111 and the USB 12 are positioned away from the second spacing groove 153.

Figure 5:
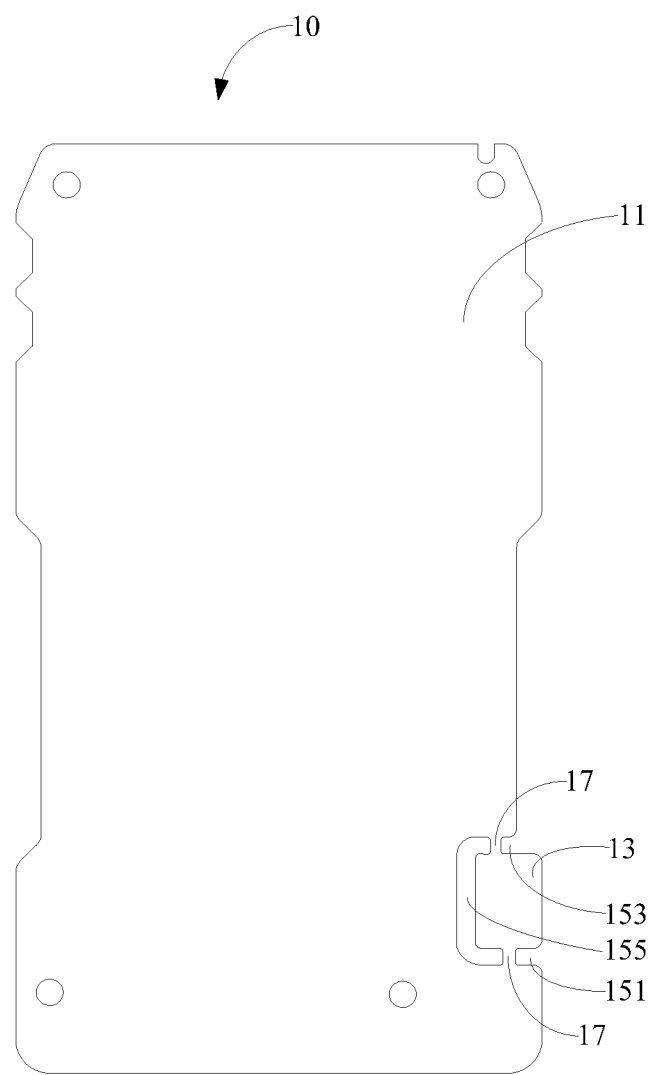
FIG. 5 is a schematic diagram of a board body referenced in FIG. 1 according to yet another embodiment.

In yet another embodiment, and in view of FIG. 5, the connecting part 17 includes two sub-parts, respectively passing through an intermediate position of the first spacing groove 151 and an intermediate position of the second spacing groove 153. Of course, and in other embodiments, the two sub-parts of the connecting part 17 may respectively pass through an intermediate position of the first spacing groove 151 and an intermediate position of the third spacing groove 155. Alternatively, the two sub-parts of the connecting part 17 may respectively pass through an intermediate position of the second spacing groove 153 and an intermediate position of the third spacing groove 155. Alternatively, the two sub-parts of the connecting part 17 may be spaced apart from each other and positioned within the first spacing groove 151. Alternatively, the two sub-parts of the connecting part 17 may be spaced apart from each other and positioned within the second spacing groove 153. Alternatively, the two sub-parts of the connecting part 17 may be spaced apart from each other and positioned within the third spacing groove 155.

Figure 6:
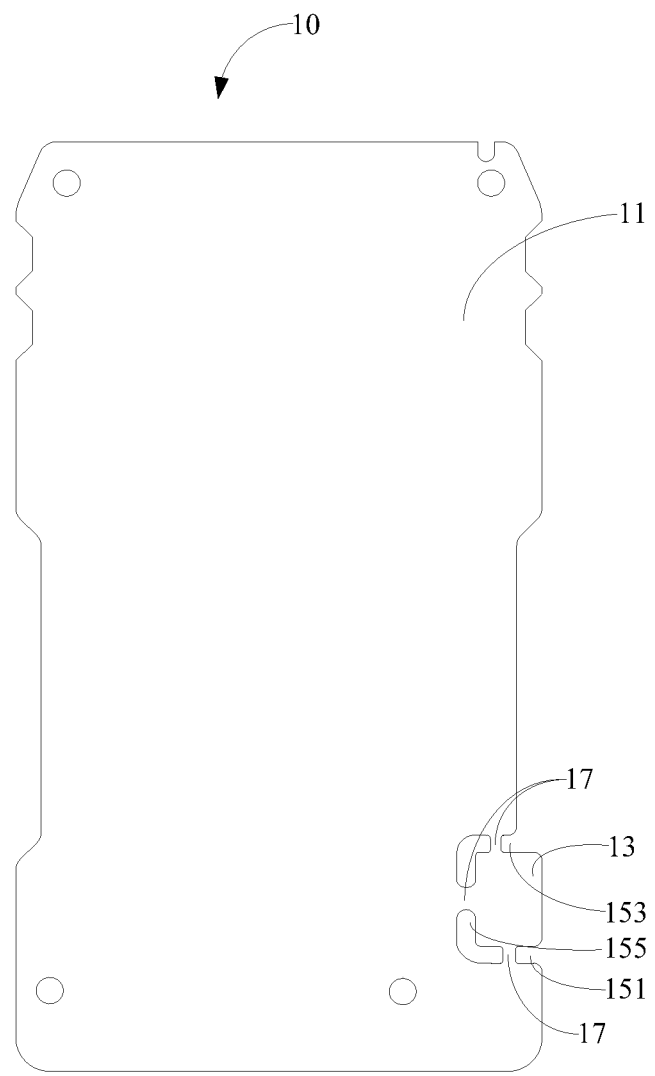
FIG. 6 is a schematic diagram of a board body referenced in FIG. 1 according to yet another embodiment.

In yet another embodiment, and in view of FIG. 6, the connecting part 17 includes three sub-parts, which respectively pass through an intermediate position of the first spacing groove 151, an intermediate position of the second spacing groove 153, and an intermediate position of the third spacing groove 155, and are not limited to such.

The spacing groove 15 is of a width greater than or equal to 1 millimeter, to facilitate configuration of the spacing groove 15. Furthermore, the spacing groove 15 is of a width small than or equal to 1.5 millimeters, to make the structure of the circuit board be more compact. For example, the width of the spacing groove 15 may be a value of 1 millimeter, 1.1 millimeters, 1.2 millimeters, 1.3 millimeters, 1.4 millimeters, 1.5 millimeters, or of an intermediate value between any two of these values.

A minimum width of the connecting part 17 is greater than or equal to 2.3 millimeters, to provide sufficient room for the wiring. Furthermore, a maximum width of the connecting part 17 is smaller than or equal to 3 millimeters to more effectively reduce stress generated by the main body part 11 and transmitted to the isolated part 13 via the connecting part 17. The connecting part 17 may be a rectangle of uniform width, with the width being of a value of 2.3 millimeters, 2.4 millimeters, 2.5 millimeters, 2.6 millimeters, 2.7 millimeters, 2.8 millimeters, 2.9 millimeters, or 3.0 millimeters, or of an intermediate value between any two of these values. The connecting part 17 may be a trapezoid of varying width, with a minimum width being of a value of 2.3 millimeters, 2.4 millimeters, 2.5 millimeters, 2.6 millimeters, 2.7 millimeters, 2.8 millimeters, or 2.9 millimeters, or of an intermediate value between any two of these values, and with a maximum width being of a value of 2.4 millimeters, 2.5 millimeters, 2.6 millimeters, 2.7 millimeters, 2.8 millimeters, 2.9 millimeters, or 3.0 millimeters, or of an intermediate value between any two of these values. The connecting part may be of any other shapes, for example, two opposing sides of the connecting part 17 may be of an arc in shape, or of other irregular shapes.

A distance between the inertial measurement unit 30 and the micro-control unit 20 is greater than or equal to 10 millimeters, to more effectively reduce thermal stress generated by the main body part 11 during operation of the micro-control unit 20 and transmitted to the isolated part 13, and accordingly to ensure accuracy of inertial measurement data detected by the inertial measurement unit 30.

In one embodiment, the circuit board 100 further includes the USB interface 12 arranged on the main body part 11, where a distance between the inertial measurement unit 30 and the USB interface 12 is greater than or equal to 5 millimeters, to reduce mechanical stress generated during operation of the USB interface 12 and transmitted to the isolated part 13, and accordingly to further ensure accuracy of inertial measurement data detected by the inertial measurement unit 30.

In one embodiment, the circuit board 100 further includes a ranging module 14 arranged on the main body part 11, where a distance between the inertial measurement unit 30 and the ranging module 14 is greater than or equal to 5 millimeters, to reduce thermal stress generated by the main body part 11 during operation of the ranging module 14 and transmitted to the isolated part 13, and accordingly to further ensure accuracy of inertial measurement data detected by the inertial measurement unit 30.

In one embodiment, the isolated part 13 is close to an end of the main body part 11, and the micro-control unit 20 is located at an intermediate position of another end of the main body part 11, such that the micro-control unit 20 is relatively far away from the inertial measurement unit 30, to reduce as much possible thermal stress generated by the main body part 11 due to heating of the micro-control unit 20 and transmitted to the isolated part 13, and accordingly to ensure accuracy of inertial measurement data detected by the inertial measurement unit 30.

In one embodiment, the circuit board 100 further includes a wireless communication module 16 arranged at an end of the main body part 11 closer to the isolated part 13, and the wireless communication module 16 is also positioned close to the micro-control unit 20. The wireless communication module 16 is in electrical connection with the micro-control unit 20 via the wiring of the main body part 11, such that the micro-control unit 20 may be in communication connection to an external environment via the wireless communication module 16. Accordingly, the wireless communication module 16 is relatively close in communication distance to the micro-control unit 20, to avoid interferences more effectively. The wireless communication module 16 is used to receive instructions sent from the ground controller (such as a remote controller) and for controlling operations of the unmanned aerial vehicle, and is used to transmit the instructions to the micro-control unit 20. At the same time, the wireless communication module 16 may transmit to the ground attitude information or image information of the unmanned aerial vehicle.

In one embodiment, the circuit board 100 further includes the USB interface 12 arranged at an end of the main body part 11 closer to the isolated part 13, and the USB interface 12 is also located close to a peripheral of the main body part 11. The USB interface 12 is in electrical connection to the micro-control unit 20 via wiring of the main body part 11, such that the micro-control unit 20 may be in communication connection to an external environment via the USB interface 12. The USB interface 12 is used for exchanges, upgrades, and data maintenance with the external environment.

In one embodiment, the circuit board 100 further includes a power switch 18 to control power-on or power-off of the circuit board 100. The power switch 18 is arranged at an end of the main body part 11 closer to the isolated part 13, and the power switch 18 is also positioned at a peripheral of the main body part 11. In this embodiment, the power switch and the USB interface are respectively positioned at two opposing sides of the wireless communication module.

In one embodiment, the circuit board 100 further includes the ranging module 14, and the ranging module is binocular. Of course, in other embodiments, the ranging module 14 may be an ultrasonic ranging sensor, or an infrared ranging sensor, or the like.

The ranging module 14 is arranged at an end of the main body part 11 closer to the isolated part 13, and is located at an intermediate position of the end of the main body part 11. The ranging module 14 is in electric connection to the micro-control unit 20 via the wiring of the main body part 11, such that the micro-control unit 20 may be in communication connection with an external environment via the ranging module 14. Accordingly, the ranging module 14 is positioned relatively far away from the inertial measurement unit 30, to more effectively reduce transmission to the isolated part 13 of thermal stress generated by the ranging module 14. The ranging module 14 is used to detect distance between the unmanned aerial vehicle and the ground surface, and to transmit detected distance information to the micro-control unit 20.

It should be noted that relational terms used herein, such as first and second, and the like, are used to distinguish one entity or operation from another entity or operation, without necessarily requiring or implying the actual existence of any such relationship or order between these entities or operations. Terms "including," "comprising," or any other variations thereof, are intended to cover a non-exclusive inclusion, such that a process, method, article, or apparatus that includes a series of elements not only includes those elements but also includes other elements not expressly listed, or those elements inherent to such process, method, article, or apparatus. In the absence of any other constraints, an element defined by the term "includes one . . . " does not exclude other same elements included in the process, method, article, or apparatus that includes the element.

Detail description has been provided to the method and apparatus mentioned above according to embodiments of the present disclosure. Specific examples are set forth herein to illustrate the principles and embodiments of the present disclosure. The above description is for the purpose of helping understand the inventive method and its core idea. At the same time, it is understood by those of ordinary skill in the art that, in accordance with the concepts of the present disclosure, alterations may be provided to the embodiments and scope of implementation thereof. Altogether, the description is not to be construed as a limitation on the present disclosure.

The content disclosed in this patent document may include material subject to copyright protection. The copyright belongs to the copyright owner. The copyright owner does not object to the facsimile reproduction by anyone of this patent document or this patent disclosure existing in the official records and archives of the Patent and Trademark Office.

What is claimed is:

1. An unmanned aerial vehicle, characterized by comprising: a vehicle body; a vehicle arm arranged on the vehicle body; and a circuit board arranged in the vehicle body, wherein the circuit board includes:
   a board body, the board body includes a wiring;
   a micro-control unit, arranged on the board body; and
   an inertial measurement unit arranged on the board body and in communication with the micro-control unit via the wiring to transmit inertial measurement data detected by the inertial measurement unit to the micro-control unit, and wherein the board body includes a main body part and an isolated part located at a peripheral of the main body part, the micro-control unit is supported on the main body part, and the inertial measurement unit is supported on the isolated part.

2. The unmanned aerial vehicle of claim 1, wherein a spacing groove is positioned between the isolated part and the main body part, and the isolated part is connected to the main body part via a connecting part.

3. The unmanned aerial vehicle of claim 2, wherein the isolated part is formed integrally with the main body part, or the isolated part is electrically connected to the main body part via a flexible circuit board.

4. The unmanned aerial vehicle of claim 2, wherein the board body extends from the peripheral to form the spacing groove, such that the spacing groove separates the main body part from the isolated part, and the main body part partly surrounds the isolated part.

5. The unmanned aerial vehicle of claim 2, wherein the spacing groove includes a first spacing groove, a second spacing groove, and a third spacing groove, wherein the first spacing groove and the second spacing groove are positioned respectively at two opposing sides of the isolated part, the third spacing groove is positioned at a side of the isolated part away from an external side of the isolated part, and two ends of the third spacing groove are respectively connected to an end of the first spacing groove and an end of the second spacing groove.

6. The unmanned aerial vehicle of claim 5, wherein the connecting part passes through an intermediate position of the first spacing groove to connect the isolated part to the main body part.

7. The unmanned aerial vehicle of claim 5, wherein the connecting part passes through an intermediate position of the second spacing groove to connect the isolated part to the main body part.

8. The unmanned aerial vehicle of claim 5, wherein the connecting part passes through an intermediate position of the third spacing groove to connect the isolated part to the main body part.

9. The unmanned aerial vehicle of claim 5, wherein the main body part includes a screw hole positioned closer to the first spacing groove than to the second spacing groove.

10. The unmanned aerial vehicle of claim 5, further comprising: a USB interface positioned on the main body part, wherein the USB interface is closer to the second spacing groove than to the first spacing groove.

11. The unmanned aerial vehicle of claim 2, wherein the spacing groove is of a width greater than or equal to 1 millimeter.

12. The unmanned aerial vehicle of claim 11, wherein the width of the spacing groove is smaller than or equal to 1.5 millimeters.

13. The unmanned aerial vehicle of claim 2, wherein the spacing groove is of a maximum width greater than or equal to 2.3 millimeters.

14. The unmanned aerial vehicle of claim 13, wherein the maximum width of the spacing groove is smaller than or equal to 3 millimeters.

15. The unmanned aerial vehicle of claim 1, wherein a distance between the inertial measurement unit and the micro-control unit is greater than or equal to 10 millimeters.

16. The unmanned aerial vehicle of claim 1, further comprising: a USB interface positioned on the main body part, wherein a distance between the inertial measurement unit and the USB interface is greater than or equal to 5 millimeters.

17. The unmanned aerial vehicle of claim 1, further comprising: a ranging module positioned on the main body part, wherein a distance between the inertial measurement unit and the ranging module is greater than or equal to 5 millimeters.

18. The unmanned aerial vehicle of claim 1, wherein the isolated part is positioned towards an end of the main body part, and the micro-control unit is positioned at an intermediate position of another end of the main body part.

19. The unmanned aerial vehicle of claim 18, further comprising: a wireless communication module positioned on the end of the main body part closer to the isolated part than to the micro-control unit, wherein the wireless communication module is positioned between the micro-control unit and the isolated part along a longitudinal axis, and wherein the wireless communication unit is in electrical connection with the micro-control unit via the wiring of the main body part, such that the micro-control unit is in communication connection with an external environment via the wireless communication module.

20. The unmanned aerial vehicle of claim 19, further comprising: a USB interface positioned on the end of the main body part close to the isolated part, wherein the USB interface is positioned close to the peripheral of the main body part, wherein the USB interface is in electric connection to the micro-control unit via the wiring of the main body part, such that the micro-control unit is in communication connection to the external environment via the USB interface.

* * * * *